(12) United States Patent
Offermanns et al.

(10) Patent No.: US 11,268,934 B2
(45) Date of Patent: Mar. 8, 2022

(54) DEVICE AND METHOD FOR DETERMINING THE CONCENTRATION OF A VAPOR

(71) Applicant: AIXTRON SE, Herzogenrath (DE)

(72) Inventors: Arno Offermanns, Aldenhoven (DE); Robert Bartholomeus Jacques Oligschlaeger, Aachen (DE)

(73) Assignee: AIXTRON SE, Herzogenrath (DE)

( * ) Notice: Subject to any disclaimer, the term of this patent is extended or adjusted under 35 U.S.C. 154(b) by 359 days.

(21) Appl. No.: 16/499,211

(22) PCT Filed: Mar. 22, 2018

(86) PCT No.: PCT/EP2018/057227
§ 371 (c)(1),
(2) Date: Sep. 27, 2019

(87) PCT Pub. No.: WO2018/177852
PCT Pub. Date: Oct. 4, 2018

(65) Prior Publication Data
US 2020/0033294 A1  Jan. 30, 2020

(30) Foreign Application Priority Data

Mar. 31, 2017  (DE) .................... 10 2017 106 967.4

(51) Int. Cl.
*G01N 29/036* (2006.01)
*C23C 14/12* (2006.01)
(Continued)

(52) U.S. Cl.
CPC .......... *G01N 29/036* (2013.01); *C23C 14/12* (2013.01); *C23C 14/543* (2013.01);
(Continued)

(58) Field of Classification Search
CPC . G01N 2291/0256; G01N 2291/02809; G01N 2291/02845; G01N 2291/0426;
(Continued)

(56) References Cited

U.S. PATENT DOCUMENTS 5,567,267 A  10/1996 Kazama et al.
5,892,207 A  4/1999 Kawamura et al.
(Continued)

FOREIGN PATENT DOCUMENTS

DE  10 2015 104 240 A1  9/2016
JP  S58 223009 A  12/1983
(Continued)

OTHER PUBLICATIONS

International Search Report dated Jun. 13, 2018, from the ISA/European Patent Office, for International Patent Application No. PCT/EP2018/057229 (filed Mar. 22, 2018), 5 pages.
(Continued)

*Primary Examiner* — Francis C Gray
(74) *Attorney, Agent, or Firm* — Ascenda Law Group, PC

(57) ABSTRACT

A device for determining the partial pressure or the concentration of a steam in a volume, includes a sensor body that can be oscillated. The temperature of the sensor body can be controlled to a temperature below the condensation temperature of the steam, and the oscillation frequency of the sensor body is influenced by a mass accumulation of the condensed steam on a surface of the sensor body. Means are provided for generating a gas flow from the sensor surface in the direction of the volume through a steam transport channel that adjoins a window to the volume. In order to
(Continued)

increase the maximum service life of the sensor body, the means for generating a gas flow has a slit nozzle designed as an annular channel.

11 Claims, 2 Drawing Sheets

(51) Int. Cl.
*C23C 14/54* (2006.01)
*G01N 29/02* (2006.01)

(52) U.S. Cl.
CPC ... *G01N 29/022* (2013.01); *G01N 2291/0256* (2013.01); *G01N 2291/02809* (2013.01); *G01N 2291/02845* (2013.01); *G01N 2291/0426* (2013.01)

(58) Field of Classification Search
CPC .... G01N 29/022; G01N 29/036; C23C 14/04; C23C 14/042; C23C 14/12; C23C 14/54; C23C 14/542; C23C 14/543
See application file for complete search history.

(56) References Cited

U.S. PATENT DOCUMENTS

| | | | |
|---|---|---|---|
| 6,125,687 | A | 3/2000 | Keine |
| 6,295,861 | B1 | 2/2001 | Keine |
| 6,467,350 | B1 * | 10/2002 | Kaduchak ............ B01D 49/006 210/748.05 |
| 7,275,436 | B2 | 10/2007 | Grimshaw |
| 7,327,948 | B1 | 2/2008 | Shrinivasan et al. |
| 8,468,899 | B1 * | 6/2013 | Mayeaux ............. G01N 1/2035 73/863.43 |
| 10,618,045 | B2 * | 4/2020 | Rivas .................... G01N 29/022 |
| 2003/0235926 | A1 * | 12/2003 | Knollenberg ........ G01N 29/222 436/181 |
| 2006/0090700 | A1 * | 5/2006 | Satoh ........................ C23F 4/00 118/715 |
| 2014/0053779 | A1 | 2/2014 | Martinson et al. |
| 2015/0315707 | A1 | 11/2015 | Xue et al. |
| 2017/0016859 | A1 | 1/2017 | Beccard et al. |
| 2019/0145870 | A1 * | 5/2019 | Black ................... G01N 1/4022 436/157 |

FOREIGN PATENT DOCUMENTS

| | | |
|---|---|---|
| WO | 99/45745 A1 | 9/1999 |
| WO | 2015/128279 A1 | 9/2015 |

OTHER PUBLICATIONS

Written Opinion dated Jun. 13, 2018, from the ISA/European Patent Office, for International Patent Application No. PCT/EP2018/057229 (filed Mar. 22, 2018), 6 pages.
Preliminary Amendment filed Sep. 30, 2019, for U.S. Appl. No. 16/499,791, filed Sep. 30, 2019, 9 pages.
International Preliminary Report on Patentability dated Oct. 1, 2019, from The International Bureau of WIPO, for International Patent Application No. PCT/EP2018/057229 (filed Mar. 22, 2018), 14 pages.
Written Opinion dated Jun. 13, 2018, from the ISA/European Patent Office, for International Patent Application No. PCT/EP2018/057229 (filed Mar. 22, 2018), translations, 6 pages.
International Preliminary Report on Patentability dated Oct. 1, 2019, from The International Bureau of WIPO, for International Patent Application No. PCT/EP2018/057227 (filed Mar. 22, 2018), 17 pages.
Written Opinion dated Jun. 12, 2018, from the ISA/European Patent Office, for International Patent Application No. PCT/EP2018/057227 (filed Mar. 22, 2018), translations, 7 pages.
Response to Office Action filed Jun. 22, 2021, for U.S. Appl. No. 16/499,791, filed Sep. 30, 2019, 4 pgs.
Non-Final Office Action dated Mar. 22, 2021, from U.S. Appl. No. 16/499,791, filed Sep. 30, 2019, 8 pgs.
International Search Report dated Jun. 12, 2018, from the ISA/European Patent Office, for International Patent Application No. PCT/EP2018/057227 (filed Mar. 22, 2018), 3 pages.
Written Opinion dated Jun. 12, 2018, from the ISA/European Patent Office, for International Patent Application No. PCT/EP2018/057227 (filed Mar. 22, 2018), 8 pages.
Office Action dated May 19, 2021, for Application No. CN 201880029467.5 (filed Mar. 22, 2018), 17 pgs.
Notice of Allowance dated Aug. 26, 2021, from U.S. Appl. No. 16/499,791, filed Sep. 30, 2019, 14 pgs.

* cited by examiner

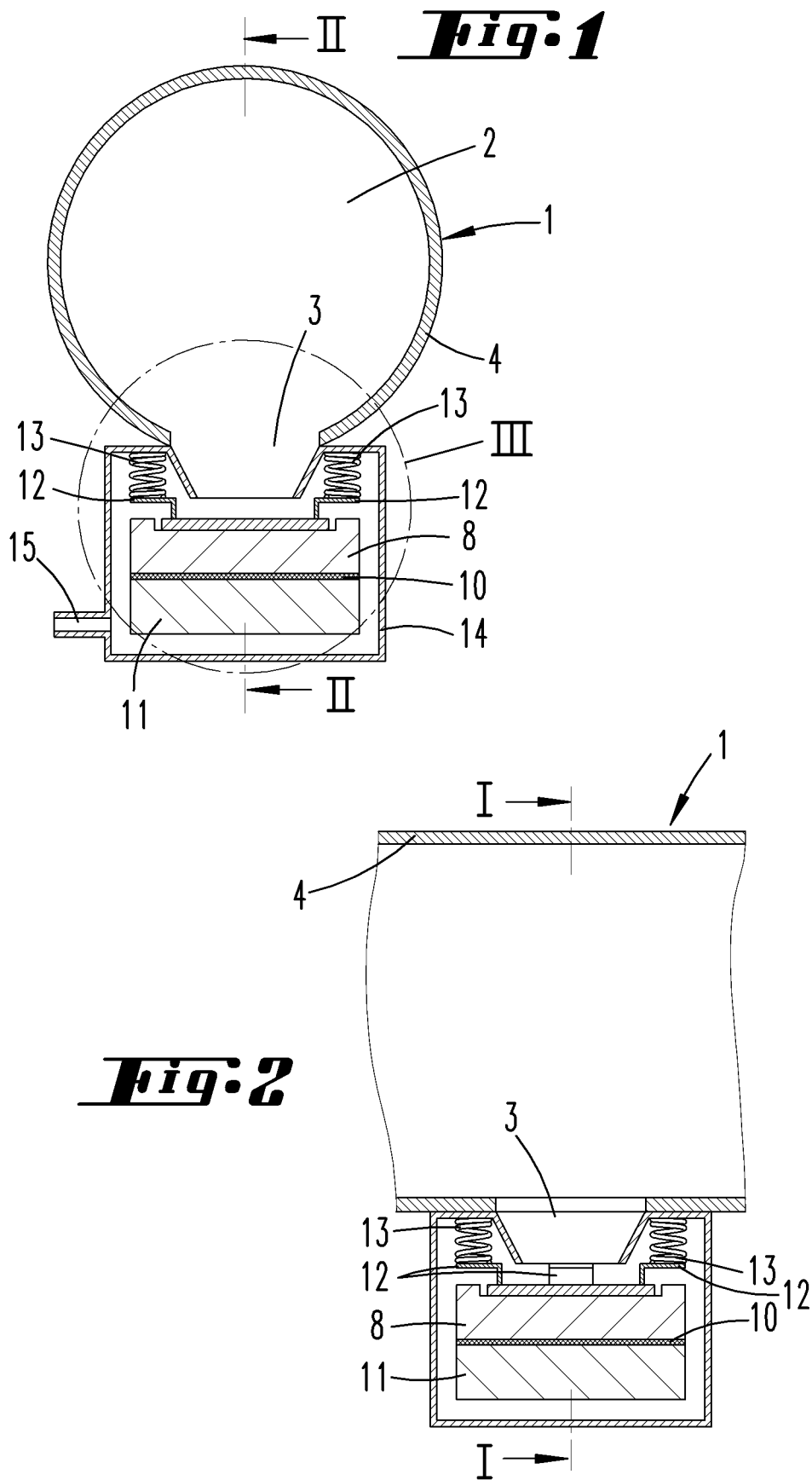

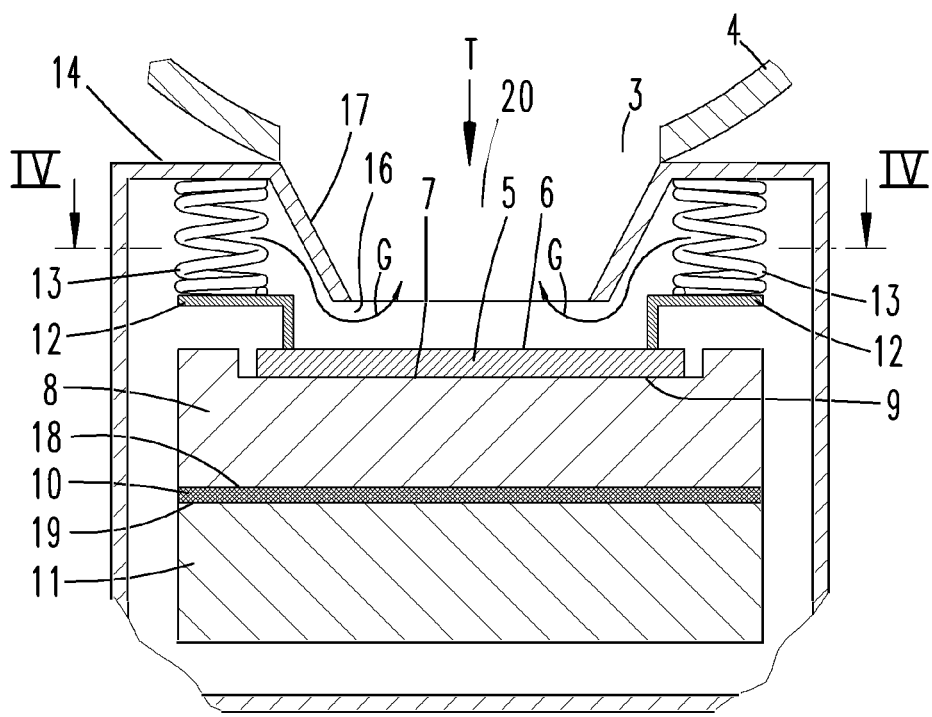
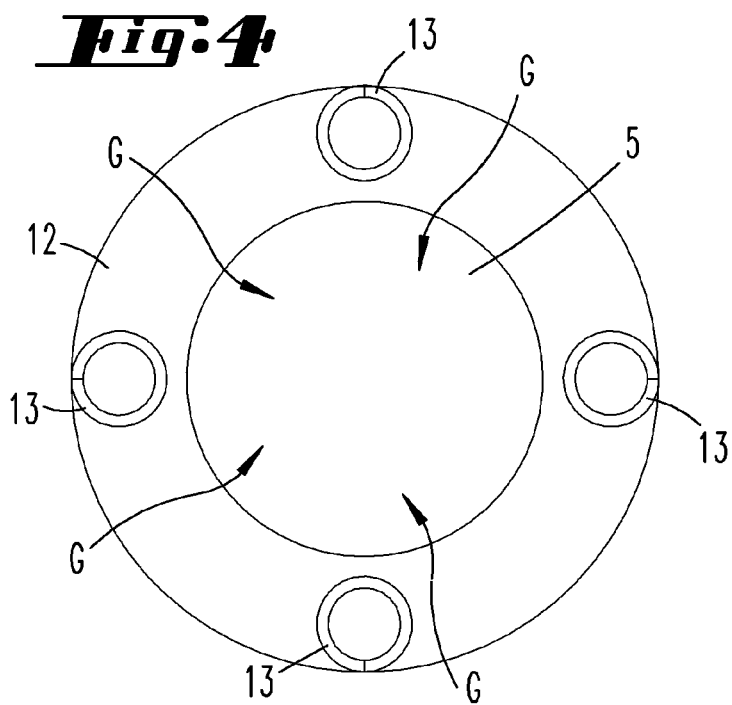

DEVICE AND METHOD FOR DETERMINING THE CONCENTRATION OF A VAPOR

RELATED APPLICATIONS

This application is a National Stage under 35 USC 371 of and claims priority to International Application No. PCT/EP2018/057227, filed 22 Mar. 2018, which claims the priority benefit of DE Application No. 10 2017 106 967.4, filed 31 Mar. 2017.

FIELD OF THE INVENTION

The invention concerns a device for determining the partial pressure or the concentration of a vapor in a volume, with a sensor body, which can be brought into oscillation, and the temperature of which can be controlled to a temperature below the condensation temperature of the vapor, and the oscillation frequency of which is influenced by an accumulated mass of the condensed vapor on a sensor surface, wherein means are provided for generating a gas flow from the sensor surface in the direction of the volume through a vapor transport channel, which adjoins a window to the volume.

The invention concerns a method for determining the partial pressure or the concentration of a vapor in a volume, with a sensor body, which can be brought into oscillation, wherein the temperature of the sensor body is controlled to a temperature below the condensation temperature of the vapor, wherein the vapor reaches the sensor surface in a transport direction so as to condense there on the sensor surface to form a accumulated mass influencing the oscillation frequency of the sensor body, wherein a gas flow is generated, directed counter to the direction of transport, which enters the volume through a vapor transport channel.

BACKGROUND

A generic device and method are disclosed by U.S. Pat. No. 6,295,861 B1. A sensor body is located in a cavity of a housing. The housing is connected to a volume by way of a vapor transport channel. Gas inlet openings open out into the housing so as to generate a gas flow from the sensor surface in a direction towards the volume.

WO 2015/128279 A1 describes a device and a method for determining the concentration of a vapor with a QCM (quartz crystal microbalance). The QCM is used to determine the vapor concentration or partial pressure of a vapor in an inert gas flow.

DE 10 2015104 240 A1 describes a similar device. There it is intended to heat the QCM on its rear face so as to bring the sensor surface to a temperature at which the accumulated mass of condensed vapor vaporizes.

US 2014/0053779 A1 describes the use of a QCM, wherein a gas flow can be fed into the sensor housing at the rear of the sensor body.

When using a QCM in a coating device to determine a layer thickness of a layer deposited on a substrate, the sensor body is in good thermal contact with the environment, and is thermally insulated with respect to a support of the sensor body.

SUMMARY OF THE INVENTION

The vapor concentration or the partial pressure of the vapor in a volume is determined with a generic sensor body, in that its oscillation frequency is influenced by an accumulated mass, generated by the condensation of the vapor on the surface of the sensor body. The resonance frequency of the sensor body drifts away from an initial value with increasing accumulated mass, wherein the alteration in frequency per unit of time is a measure of the vapor concentration in the volume. The increase in mass over time on the sensor surface of the sensor body is also influenced by the transport properties, in particular the diffusion property of the gas phase in the volume, and also the length of a vapor transport channel, which has the function of a diffusion channel, between a window to the volume and the sensor surface of the oscillating sensor body.

The service life or durability of such a sensor body is limited by the attainment of a maximum accumulated mass on the sensor surface. If this maximum accumulated mass is reached, the sensor body must either be replaced, or cleaned by heating. For the latter purpose the sensor body is heated to a temperature above the condensation temperature of the vapor, so that the condensate is sublimated from the sensor surface.

The invention is based on the object of improving the method and the device described above, in particular so as to increase the maximum service life of the sensor body.

The object is achieved by the invention specified in the claims, wherein each claim, and also each subsidiary claim, represents an independent solution of the object, and the individual claims can be combined in any manner with one another, wherein the combination of individual features of claims is also envisaged.

First and foremost, it is proposed that means are provided to generate a gas flow, in particular an inert gas flow, directed counter to the direction of vapor transport towards the sensor surface. The transport of the vapor from the volume towards the sensor surface essentially takes place by means of diffusion, and in particular by diffusion through a vapor transport channel. The inventive gas flow is directed counter to the direction of transport, that is to say, for example, the direction of diffusion. With suitable flow generating means, the gas is intended to flow from the sensor surface in the direction of a window, through which the vapor can enter into the vapor transport channel. A "tooling factor" can be specified by a suitable selection of the volumetric flow rate or mass flow rate of the gas flow flowing counter to the direction of transport through the vapor transport channel. The condensation rate of the vapor on the sensor surface can be reduced by selecting a suitable gas flow rate. The maximum accumulated mass on the sensor surface is only reached after a longer operating time, due to a gas flow in the vapor transport channel directed counter to the diffusion. In a preferred configuration of the invention, the gas flow, which can also be described as a purge gas flow, is fed in directly adjacent to the sensor surface of the sensor body. In a preferred configuration, the window to the volume is adjoined by a vapor transport channel, which is surrounded by an annular wall. This wall can preferably take the form of a pipe stub, or more particularly, a funnel-shaped apron. This wall extends directly up to the sensor surface, wherein the sensor surface can run parallel to the surface of the window. An edge of the wall can be spaced apart from the surface of the sensor body. However, the edge can also be spaced apart from a holder surrounding the sensor body. The gap thereby formed forms a flat nozzle, through which the gas flow flows in a direction parallel to the sensor surface. A gas flow preferably develops from the edge of the sensor surface in a direction towards the center of the sensor surface. The flat nozzle preferably takes the form of an annular flat nozzle. The sensor body is preferably mounted on a support, which is arranged in a sensor housing. The sensor housing has a gas supply line, through which the gas can be fed into the sensor housing. A gas flow can flow in through a gas line forming the volume, with which an organic vapor is transported. The volume and in particular the heated gas line, which is designed as a pipe, has a window. This window has an opening, through which the vapor can diffuse. The pipe stub, which forms a diffusion path, is preferably connected to the window. The pipe stub has a free edge, which is spaced apart from the sensor surface. By this means a gap is formed. The gap forms a wide slit nozzle, which can have the shape of an annular channel. The gas flow flowing through this annular channel into the pipe stub generates a flow directed counter to the diffusion, so that the average transport velocity of the vapor from the window towards the sensor surface can be adjusted by adjusting the flow velocity. In the course of the adjustment, the flow through the pipe stub is adjusted such that the increase of mass on the sensor surface with time is great enough to obtain a sufficiently high signal-to-noise ratio.

In a coating facility comprising one of the concepts of the invention, which has a process chamber into which the vapor is fed by means of a gas inlet device, an inventive sensor arrangement can be arranged both in the vapor supply line and also in the process chamber, that is to say, on the edge of the process chamber. The vapor transported through the gas supply line is diluted several times on its path from the vaporizer to the process chamber, or more particularly, to the gas inlet device, so that a partial vapor difference of 5:1 can occur between the vapor generator and the process chamber. As a result of the gas being fed into the pipe stub, an identical partial pressure sensor can be used both in the vapor supply line and also in the process chamber. With the gas flow, which forms a "tooling gas flow", the sensitivity of the sensor can be adjusted by a factor greater than 10. This is particularly important if a plurality of gas supply lines are provided on a coating device for purposes of supplying various vapors, wherein one vapor represents a dopant, which is fed into the process chamber at only a very low partial pressure. For purposes of measuring a dopant vapor the device can preferably be used without an additional gas in-feed.

Provision is made for the sensor body to have a sensor surface facing towards the volume, on which the vapor transported through a vapor transport channel from the volume to the sensor body can condense into an accumulated mass. To this end, the sensor surface, and in particular the entire sensor body, must be cooled to a temperature that lies below the condensation temperature of the vapor. The volume, which preferably takes the form of a gas transport channel through which an organic vapor is transported with an inert gas, is kept at a temperature that is above the condensation temperature of the vapor; this temperature, for example, can be 350° C. The surface temperature of the sensor body, on the other hand, should be 220° C. To achieve this, the rear face of the sensor body, opposite the sensor surface, is located on a heat transfer surface of a heat conductor, by means of which the heat is transported from the sensor body to a cooling element, with which the heat is dissipated. In accordance with the invention, the heat transfer body between the heat transfer surface and a heat dissipation surface is formed by a heating element, with which the sensor body can be heated, such that the sensor surface reaches a temperature at which the condensate accumulated on the latter can sublimate. For this purpose the temperature preferably reaches at least 350° C. In order to accelerate the heating process of the sensor body, an insulation element can be arranged between the heating element and the cooling element, which insulation element has a lower thermal conductivity than the heat transfer body formed by the heating element. The heating element can take the form of an element that can be electrically heated. It can have a heating resistance, through which an electrical heating current flows, so as to heat the heating element up to the vaporization temperature at which the accumulated mass can be vaporized. The insulation element preferably has an insulation effect such that the heating rate or cooling rate is approximately 3° C./sec. The insulation element forms a heat flow resistance and is preferably designed such that a temperature difference of at least 160° C. can form between a heat dissipation surface of the heating element and a cooling surface of the cooling element, if the cooling element performs a cooling function and at the same time the heating element performs a heating function, in which the sensor body is heated to a temperature above the vaporization temperature of the condensate. After completion of the cleaning step, in which the vaporized condensate is transported with a gas flow through the vapor transport channel into the volume, and the heating of the heating element is terminated, heat is extracted from the heating element, through the insulation element, by the cooling element, such that it can cool down to the operating temperature at which vapor can condense on the sensor surface. The thickness of the insulation element, that is to say, its thermal conductivity, is selected such that the heating times for cleaning purposes are not too long, and on the other hand, the cooling times after the cleaning step are also not too long. It is sufficient if the above-cited temperature difference of 160° C. is reached with a heat output that is 80% of that of the heating element. With the inventive configuration of the sensor body support as a heating element, through which heat can be transferred from the sensor body to the cooling element, the cleaning cycles can be shortened to times of between 2 and 3 minutes. The gas flow, which is led from the edge of the sensor surface over the sensor surface, also accelerates the cleaning process, by transporting the vaporized vapor to the volume.

A further aspect of the invention is the thermal decoupling of the sensor body from the wall of the volume, or more particularly, a pipe stub connected to the wall in terms of heat conduction. The wall of the volume can thus be heated without the heat supply to the wall resulting in an increase in the temperature of the sensor body. In accordance with the invention, a thermal insulation element is provided between the edge of the sensor body and a housing part connected to the wall of the volume in terms of heat conduction. This thermally insulating element can take the form of a spring, in particular a compression spring. As a result of this configuration, the sensor surface can have a temperature that is at least 100° C. lower than the temperature of the wall of the volume.

The sensor body is preferably formed by a QCM (quartz crystal microbalance), which takes the form of an oscillating body formed by a crystal. The oscillating body may preferably consist of $GaPO_4$. The sensor arrangement is preferably used to determine the vapor of an organic precursor, which is transported by means of an inert gas flow through a gas line forming the volume. The vapor is transported to a gas inlet device of a coating facility, in which OLED components, such as screen displays or the like, are manufactured. In particular, the sensor arrangement is part of a control loop, with which a constant vapor flow rate is directed into the process chamber of an OLED coating device. The volume can be formed by a deposition chamber, the walls of which have a temperature that is lower than the condensation temperature of the gas, wherein there is no flow through such a volume, which preferably also does not have an inert gas atmosphere, but essentially only a vapor source, for example a vaporizer for purposes of generating the vapor, and a substrate on which the vapor is intended to condense. Preferably, however, the volume is formed by a vapor transport line in the form of a heated pipeline, through which the vapor generated by a vapor generator is transported by means of a carrier gas. The walls of the vapor transport line have a temperature that is higher than the condensation temperature of the vapor. Quartz can be used as the material for the sensor body. Preferably, however, a material is used which can be used above 50° C., and preferably well above 50° C., as an oscillating body. When the sensor body is operated on a vapor transport line, the condensation rate of the vapor on the sensor surface is about 5 times higher than when the sensor body is used on or in a volume, in which a vapor is generated without the formation of a flow, that is to say, as mentioned above, in a deposition chamber. If the sensor body is preferably to be used on a vapor transport line through which vapor flows, the sensors used must have a sensitivity that is about five times higher. The inventive measures are intended to meet these requirements. The sensor body achieves a longer service life, although a higher deposition rate can be expected when the sensor is operating on a vapor transport line.

With a QCM from the prior art, with which the thickness of a layer deposited on a substrate is determined by altering the oscillation frequency, there is a poor connection in terms of heat conduction between the sensor body and a sensor body support. In contrast, there is a good connection in terms of heat conduction to the environment, that is to say, to the vapor or to a carrier gas. If the sensor body support is cooled in this arrangement, disadvantageous condensation can occur external to the sensor surface. In accordance with the invention, there is a good connection in terms of heat conduction between the rear face of the sensor body and the sensor body support, which here is a heat transfer body. The surface of the heat transfer body can have the function of an electrical contact. Another electrical contact is achieved by way of spring elements. While in the prior art the spring elements are supported on the rear face of the sensor body, in accordance with the invention the sensor surface is acted upon by the spring elements, particularly at its edge, so that the rear face of the sensor body is in good thermal conductive contact with the heat transfer body. This arrangement, which is inverted with respect to the prior art, decouples the temperature of the sensor body from the temperature of the environment, that is to say, that of the vapor or the carrier gas.

BRIEF DESCRIPTION OF THE DRAWINGS

In what follows the invention is described in detail with the aid of an example embodiment. Here:

FIG. 1 shows a cross-section along the line I-I in FIG. 2 of a gas transport line 1, with which the vapor of an organic source material is transported from a vapor source to a gas inlet device of an OLED coating device, wherein the line of cut I-I is positioned centrally through a window 3 in the wall 4 of the vapor transport line 1;

FIG. 2 shows the cross-section along the line II-II in FIG. 1;

FIG. 3 shows at an enlarged scale the detail III in FIG. 1; and

FIG. 4 shows a cross-section along the line IV-IV in FIG. 3.

DETAILED DESCRIPTION

The vapor transport line 1 forms a volume 2, through which passes a vapor of an organic source material, transported by an inert gas. The wall 4 of the vapor transport line is heated to a temperature above the condensation temperature of the vapor, for example to 350° C.

The volume 2 of the vapor transport line 1 is connected to a sensor surface 6 of a sensor body 5 by way of a window 3, and an adjoining vapor transport channel 20. The diameter of the vapor transport channel 20 corresponds approximately to the diameter of the window 3. In one embodiment, the vapor transport channel 20 is surrounded by a pipe stub 17, which forms a funnel-shaped apron, which forms a free edge on its side facing away from the window 3.

The edge of the pipe stub 17 is spaced apart from the sensor surface 6 by a gap. This gap forms an annular flow channel 16, such that a flat nozzle is formed, through which a gas flow G can flow.

The vapor of the organic source material contained in the volume 2 is transported, in particular by diffusion, in a direction of transport T through the window 3 and the vapor transport channel 20 towards the sensor surface 6 of the sensor body 5. Here the vapor is transported counter to the gas flow G, which flows against the direction of transport T through the vapor transport channel 20 and the window 3. The transport rate of the vapor in the direction of transport T towards the sensor surface 6 can thus be adjusted by the mass flow rate or the volumetric flow rate of the gas flow G.

A cooling element 11 is provided, which is connected in terms of heat conduction to the rear face 7 of the sensor body 5 by way of a heat transfer body. With the cooling element 11 the sensor surface 6 is cooled down to a temperature of, for example 220° C., at which temperature the vapor condenses on the sensor surface 6.

The sensor body 5 is formed by a QCM, which is set into oscillation with suitable means known from the prior art. In particular, the QCM is part of a resonant circuit. The resonance frequency of the QCM is influenced by the accumulated mass of condensed vapor formed on the sensor surface 6. From the alteration of the resonance frequency, conclusions can be drawn about the vapor concentration or the partial pressure of the vapor in the volume 2. The rate of mass accumulation on the sensor surface 6 can be reduced by increasing the gas flow G. This allows the cycle duration of the sensor body 5 to be extended.

According to one aspect of the invention, the heat transfer body is a heating element 8. The heating element 8 has a heat transfer surface 9, which is in heat conductive contact with the rear face 7 of the sensor body 5. A heat dissipation surface 18, which differs from the heat transfer surface 9 and in one embodiment is located opposite the heat transfer surface 9, is connected in terms of heat conduction to a cooling surface 19 of the cooling element 11, such that the heating element 8 has the function of a heat transfer body if no electrical heat output is fed into the heating element 8.

In one embodiment, provision is also made for an insulation element 10 to be arranged between the heat dissipation surface 18 of the heating element 8 and the cooling surface 19 of the cooling element 11. The insulation element 10 has a lower thermal conductivity than that of the heating element 8. The thermal conductivity property of the insulation element 10 is selected such that, if the cooling capacity of the cooling element 11 is not switched off, the sensor surface 6 can, by feeding electrical heating power into the heating element 8, be heated up to a temperature at which the condensate accumulated on the sensor surface 6 can sublimate. The heat transfer surface 9 thus has the function on the one hand of dissipating heat from the sensor body 5 during normal operation, and on the other hand of supplying heat to the sensor body 5 during the cleaning operation.

If the heat supply to the heating element 8 is terminated, heat is extracted from the heating element 8 through the insulation element 10. The heating element 8 cools down and also extracts heat from the sensor body 5, such that the sensor surface 6 is brought down to a temperature below the condensation temperature of the vapor.

The heating element 8, the insulation element 10 and the cooling element 11 form a sensor body support, which is inserted in a housing 14, into which a gas supply line 15 opens, through which the gas flow, which flows as a purge gas flow G, is fed through the annular gap-shaped opening between the edge of the pipe stub 17 surrounding the vapor transport channel 20 and the sensor surface 6, and into the vapor transport channel 20. The gas flow G preferably consists of an inert gas. This can be nitrogen, an inert gas or hydrogen. The gas flow G preferably consists of the same substance as the carrier gas flow, with which the vapor is transported through the volume 2 formed by a gas line.

A contact element 12 is provided, which has an annular shape and surrounds a central region of the sensor surface 6. The sensor body 5 is preferably excited so as to oscillate such that the contact line of the contact element runs along a node line. The rear face of the sensor body 5 forms a counter contact to the contact element 12. The contact element 12 and the counter contact are connected to an electronic circuit for purposes of executing the oscillation.

A plurality of spring elements 13 are preferably provided, with which the contact element 12 is supported on a hot part of the housing. The spring elements 12 thus offer a heat transfer resistance in the form of a heat insulation element, so that the temperature of the sensor body 5 can be set essentially independently of the temperature of the wall 4 of the volume 2, or the temperature of the pipe stub 17.

The above statements serve to explain the inventions recorded by the application as a whole, which develop the prior art at least by means of the following combinations of features, and in each case also independently, wherein two, a plurality, or all, of these combinations of features can also be combined, namely:

A device, which is characterized in that means are provided for generating a gas flow from the sensor surface 6 in the direction of the volume 2.

A device, which is characterized in that the means for generating the gas flow are provided in the immediate vicinity of the sensor body 5.

A device, which is characterized in that the means for generating a gas flow are formed by a wide slit nozzle.

A device, which is characterized in that the wide slit nozzle is formed by an annular channel 16.

A device, which is characterized by a vapor transport channel 20 adjoining a window 3 to the volume 2.

A device, which is characterized in that the vapor transport channel 20 is surrounded by a pipe stub 17, which adjoins the window 3 at one end, and at its other end is spaced apart from the sensor surface 6 by a gap, wherein the gap forms a flow channel 16 for feeding the gas flow into the vapor transport channel 20.

A device, which is characterized in that the volume 2 is formed by a vapor transport line 1, through which a carrier gas transporting the vapor can flow.

A device, which is characterized in that the volume 2 is formed by a process chamber of a coating device.

A method, which is characterized in that a gas flow is generated in a direction counter to the direction of transport T.

A method, which is characterized in that the gas flow is fed from the edge of the sensor surface 6 in a direction towards the center of the sensor surface 6, and enters into the volume 2 through a window 3.

A method, which is characterized in that the gas flow flows through a vapor transport channel 20 towards the window 3.

A method, which is characterized in that the gas flow is fed in through a gap between an edge of a pipe stub 17, bounding the vapor transport channel 20, and the edge of the sensor surface 6.

A method or a device, which is characterized in that the sensor body 5 rests on a heating element 8, which is connected in terms of heat conduction to a cooling element 11, in particular by way of an insulating element 10.

A method, which is characterized in that the volume 2 is formed by a vapor transport line 1, through which the vapor is transported by means of a carrier gas.

All disclosed features are essential to the invention (both individually, and also in combination with one another). In the disclosure of the application, the disclosure content of the associated/attached priority documents (copy of the prior application) is hereby also incorporated in full, also for the purpose of incorporating features of these documents in the claims of the present application. The subsidiary claims characterize, even without the features of a claimed claim, with their features independent inventive developments of the prior art, in particular in order to make divisional applications on the basis of these claims. The invention specified in each claim can additionally comprise one or a plurality of the features described in the above description, in particular with features provided with reference symbols and/or specified in the list of reference symbols. The invention also relates to forms in which individual of the features mentioned in the above description are not implemented, in particular insofar as they are recognizably dispensable for the respective purpose, or can be replaced by other technically equivalent means.

LIST OF REFERENCE SYMBOLS

1 Vapor transport line
2 Volume
3 Window
4 Wall
5 Sensor body
6 Sensor surface
7 Rear face
8 Heating element
9 Heat transfer surface
10 Insulation element
11 Cooling element
12 Contact element
13 Spring element
14 Housing
15 Gas supply line
16 Flow channel
17 Pipe stub
18 Heat dissipation surface
19 Cooling surface
20 Vapor transport channel
G Purge gas flow
T Direction of transport

What is claimed is:

1. A device for determining a partial pressure or a concentration of a vapor in a volume (2), the device comprising:
   a sensor body (5) configured to be brought into oscillation, the sensor body having a temperature that is controllable to a temperature below the condensation temperature of the vapor, and an oscillation frequency that is influenced by an accumulated mass formed by the vapor condensing on a sensor surface (6) of the sensor body (5), wherein a vapor transport channel (20) adjoins a window (3) to the volume (2), through which the vapor diffuses in a direction of transport (T) towards the sensor surface (6); and
   an annular channel (16) that forms a wide slit nozzle through which a gas flow is generated, the gas flow flowing from the sensor surface (6) towards the vapor transport channel (20) in a direction counter to the direction of transport (T) of the diffusion of the vapor.

2. The device of claim 1, wherein the annular channel (16) is provided in an immediate vicinity of the sensor body (5).

3. Device A for determining a partial pressure or a concentration of a vapor in a volume (2), the device comprising:
   a sensor body (5) that is configured to be brought into oscillation, sensor body (5) having a temperature that is controllable to a temperature below a condensation temperature of the vapor, and an oscillation frequency that is influenced by an accumulated mass formed by the vapor condensing on a sensor surface (6) of the sensor body (5);
   a pipe stub (17) surrounding a vapor transport channel (20), wherein at a first end of the pipe stub (17), the pipe stub (17) adjoins a window (3) to the volume (2) and at a second end of the pipe stub (17), the pipe stub (17) is spaced apart from the sensor surface (6) by a gap; and
   flow generating means configured to generate a gas flow that is fed through the gap and into the vapor transport channel (20).

4. The device of claim 1, wherein the volume (2) is formed by a vapor transport line (1) through which the vapor is transported by means of a carrier gas.

5. The device of claim 1, wherein the volume (2) is formed by a process chamber of a coating device.

6. A method for determining a partial pressure or a concentration of a vapor in a volume (2), the method comprising:
   oscillating a sensor body (5) at an oscillation frequency;
   controlling a temperature of the sensor body (5) to a temperature below a condensation temperature of the vapor;
   diffusing, in a direction of transport (T), the vapor through a vapor transport channel (20) to reach a sensor surface (6) of the sensor body (5)
   condensing the vapor on the sensor surface (6);
   as a result of the vapor condensing on the sensor surface (6), forming an accumulated mass on the sensor surface, the accumulated mass influencing the oscillation frequency of the sensor body (5);
   feeding a gas flow in from an edge of the sensor surface (6) in a direction towards a center of the sensor surface (6); and
   flowing the gas flow counter to the direction of transport (T) through the vapor transport channel (20) and into the volume (2).

7. The method of claim 6, wherein the gas flow is fed through a gap between an edge of a pipe stub (17) bounding the vapor transport channel (20), and the edge of the sensor surface (6).

8. The method of claim 6, wherein the volume (2) is formed by a vapor transport line (1), through which the vapor is transported by means of a carrier gas.

9. The method of claim 6, wherein an average transport velocity of the vapor through the vapor transport channel (20) towards the sensor surface (6) is adjusted by adjusting a flow velocity of the gas flow.

10. The device of claim 2, wherein the volume (2) is formed by a vapor transport line (1) through which the vapor is transported by means of a carrier gas.

11. The device of claim 2, wherein the volume (2) is formed by a process chamber of a coating device.

* * * * *